United States Patent [19]
Wong et al.

[11] Patent Number: 5,621,342
[45] Date of Patent: Apr. 15, 1997

[54] LOW-POWER CMOS DRIVER CIRCUIT CAPABLE OF OPERATING AT HIGH FREQUENCIES

[75] Inventors: Stephen L. Wong, Scarsdale; Vinit Jayaraj, Ossining; Rafael Aquino, Beacon, all of N.Y.

[73] Assignee: Philips Electronics North America Corporation, New York, N.Y.

[21] Appl. No.: 550,129

[22] Filed: Oct. 27, 1995

[51] Int. Cl.$^6$ .................................................. H03K 3/00
[52] U.S. Cl. ........................ 327/108; 327/427; 327/112
[58] Field of Search ........................... 327/108–112, 427, 327/434, 435, 437, 310, 379, 382, 383; 326/49, 50, 21, 26, 27

[56] References Cited

U.S. PATENT DOCUMENTS

| | | | |
|---|---|---|---|
| 4,877,980 | 10/1989 | Kubinec | 307/542 |
| 4,952,818 | 8/1990 | Erdelyi et al. | 327/108 |
| 5,089,722 | 2/1992 | Amedeo | 326/27 |
| 5,126,588 | 6/1992 | Reichmeyer et al. | 307/270 |
| 5,317,206 | 5/1994 | Hanibuchi et al. | 307/443 |
| 5,329,177 | 7/1994 | Nagai | 307/451 |
| 5,495,195 | 2/1996 | Fontana et al. | 327/108 |

FOREIGN PATENT DOCUMENTS

| | | | |
|---|---|---|---|
| 0301603B1 | 2/1989 | European Pat. Off. | G11C 7/00 |
| 0332301 | 9/1989 | European Pat. Off. | H03K 17/16 |

*Primary Examiner*—Toan Tran
*Attorney, Agent, or Firm*—Steven R. Biren

[57] ABSTRACT

A low-power CMOS driver circuit capable of operating at high frequencies includes a CMOS output driver circuit and a pair of CMOS predriver circuits for driving the CMOS output driver circuit. A timing circuit is provided for generating three different timing signals for switching the predriver circuits in such a manner that the CMOS driver circuit is capable of operating at frequencies above 1 MHz without dissipating significant power.

6 Claims, 3 Drawing Sheets

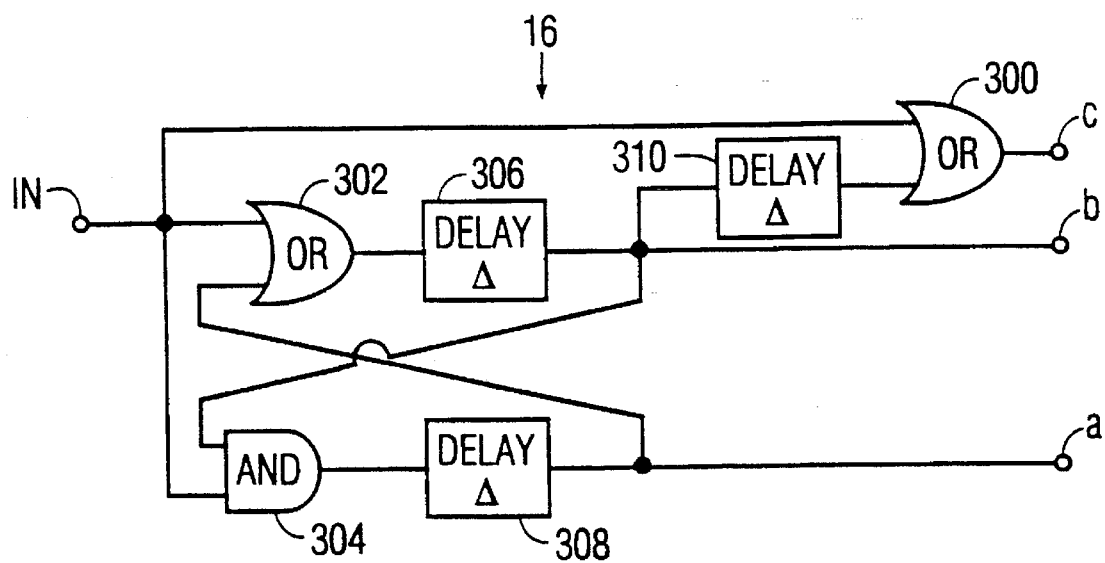
FIG. 3
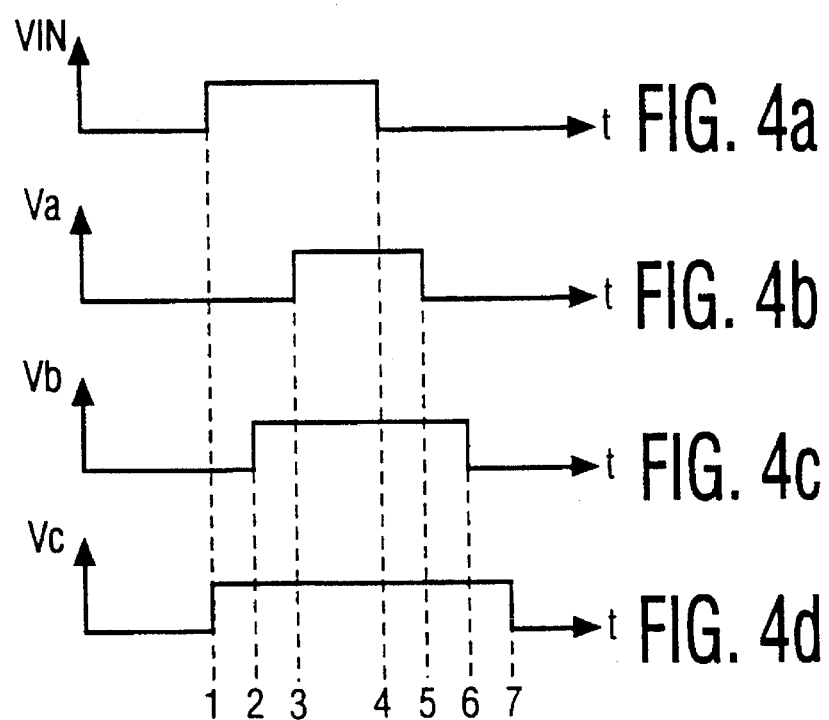
FIG. 4a
FIG. 4b
FIG. 4c
FIG. 4d

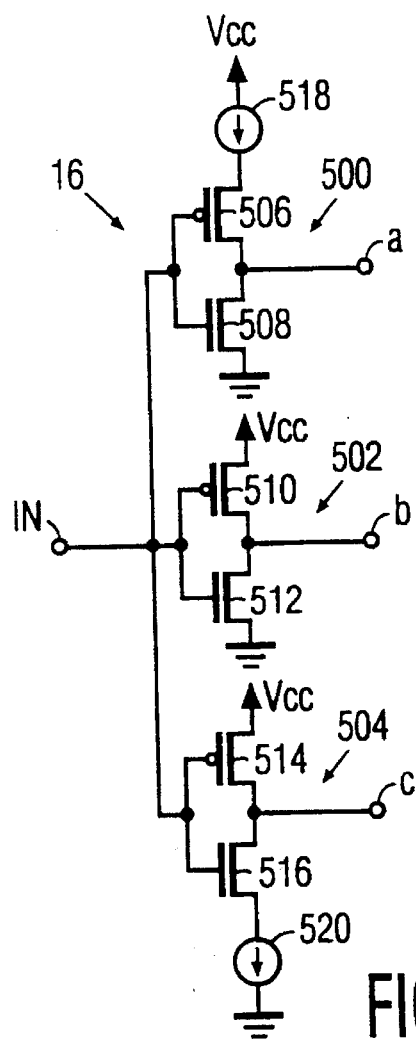
FIG. 5
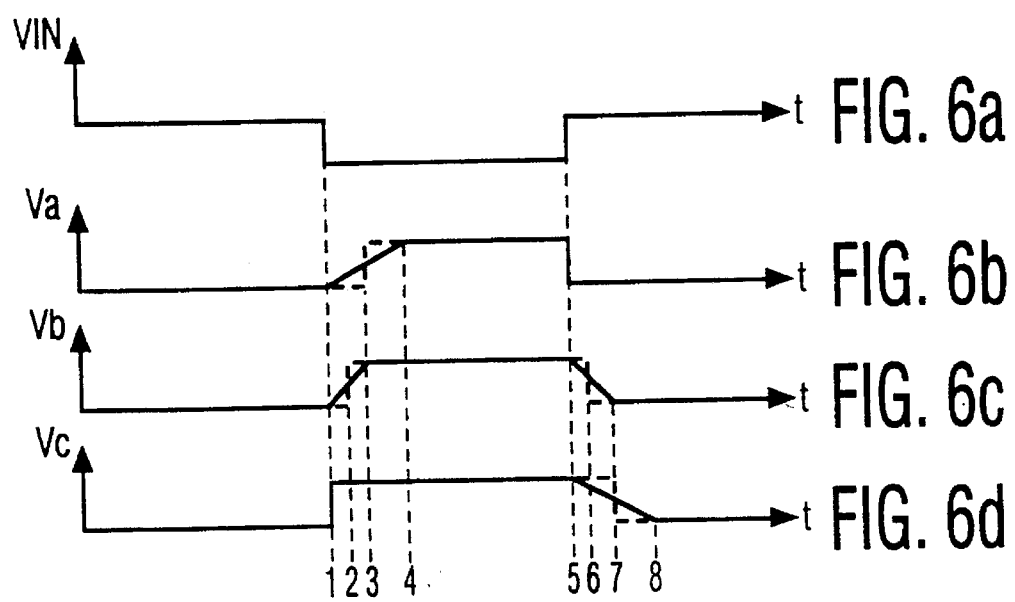
FIG. 6a
FIG. 6b
FIG. 6c
FIG. 6d

LOW-POWER CMOS DRIVER CIRCUIT CAPABLE OF OPERATING AT HIGH FREQUENCIES

BACKGROUND OF THE INVENTION

This invention is in the field of digital circuits, and relates more particularly to low-power CMOS driver circuits capable of operating at high frequencies without dissipating significant power.

Standard CMOS drivers, having a circuit configuration such as that shown by transistors 510 and 512 in FIG. 5, are normally quite adequate for driving relatively large off-chip capacitive loads, such as the gate of a power transistor. However, during each transition of the input waveform, there is an instant of time when both the NMOS and PMOS transistors will conduct simultaneously. This will permit current to flow directly from the power supply terminal (Vcc) to the common terminal (ground) through a relatively low impedance, thus dissipating unnecessary power. This phenomenon is known as shoot-through dissipation, and since it increases with frequency (as the number of input transitions per unit of time increases), as well as with the size of the driver, the use of standard CMOS drivers is typically limited to low-frequency (i.e., below about 100 KHz) applications and smaller drivers.

For operation at moderately higher frequencies (i.e. from about 100 KHz to about 1 MHz) the two CMOS driver transistors can be provided with separate gate drive signals. Then, by using a timing circuit, it can be ensured that there will be a slight time delay between activation of one transistor of the CMOS pair and deactivation of the other transistor, so that both transistors will never be on simultaneously, thus substantially preventing shoot-through current from flowing between the power supply terminal and ground.

However, for operation at still higher frequencies (i.e. above 1 MHz), the output driver size typically becomes very large, so that typical timing circuits are not capable of driving the output transistors with sufficient speed. In order to overcome this difficulty, CMOS predriver circuits can be used to boost the driving capability of the timing circuit to drive the output driver stage. However, at these higher frequencies, the predrivers themselves can be quite large, and, if conventional CMOS stages are used as predrivers, significant shoot-through power will be dissipated in the predrivers during transitions. Thus, even with the use of a timing circuit and predrivers, the maximum operating frequency of prior-art CMOS driver circuits is still limited by shoot-through dissipation to about 1 MHz.

Optimally, it would be desirable to have a CMOS driver circuit capable of driving relatively large off-chip capacitive loads (in the range of 1 to 2 nF), such as the gate of a power transistor, at frequencies in the range of several MHz without dissipating significant power due to shoot-through current.

SUMMARY OF THE INVENTION

It is thus an object of the invention to provide a CMOS driver circuit capable of driving relatively large off-chip capacitive loads at high frequencies in the range of several MHz.

It is a further object of the invention to provide an economical CMOS driver circuit capable of driving relatively large capacitive loads at high frequencies without significant shoot-through power dissipation.

In accordance with the invention, these objects are achieved by a new CMOS driver circuit having two levels of zero-shoot-through drivers (dual predrivers and an output driver) which are controlled by a timing circuit which provides three different timing signals to the predriver stages (and through the predriver stages to the output driver), with the three timing signals having differing waveforms which permit the operation of the CMOS driver circuit while substantially eliminating shoot-through-power dissipation in the circuit.

In a preferred embodiment of the invention, the three different timing signals are substantially square-wave pulses, with the pulses of each timing signal having different pulsewidths than the pulses of the other timing signals. Alternatively, the timing signals may differ from each other by having at least one of a different rise time and a different fall time.

In a further preferred embodiment of the invention, the timing circuit includes three CMOS inverter circuits, with current sources inserted in selected ones of the CMOS inverter circuits to provide the different rise and/or fall times for the three timing signals. Alternatively, the timing circuit may be implemented digitally, by a circuit using a combination of AND and OR gates and delay elements, in which case the three timing signals will be substantially square-wave signals having different pulsewidths.

CMOS driver circuits configured in accordance with the invention are capable of driving relatively large off-chip capacitive loads at high frequencies without significant shoot-through power dissipation.

BRIEF DESCRIPTION OF THE DRAWING

The invention may be more completely understood with reference to the following detailed description, to be read in conjunction with the accompanying drawing, in which:

FIG. 3 shows a first embodiment of a timing circuit for use in the CMOS driver circuit of FIG. 1;

FIGS. 4a–4d show a series of waveforms illustrating the operation of the timing circuit of FIG. 3;

FIG. 5 shows a second embodiment of a timing circuit for use in the CMOS driver circuit of FIG. 1; and FIGS. 6a–6d show a series of waveforms illustrating the operation of the timing circuit of FIG. 5.

DESCRIPTION OF THE PREFERRED EMBODIMENTS

Figure 1:
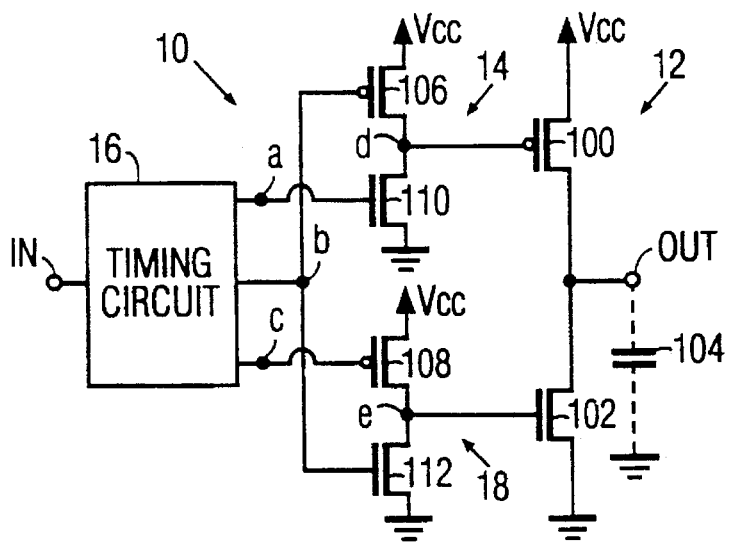
FIG. 1 shows a CMOS driver circuit in accordance with the invention.

A CMOS driver circuit 10 in accordance with the invention is shown in FIG. 1. The driver circuit 10 includes an output driver circuit stage 12 having a PMOS transistor 100 and an NMOS transistor 102 having their main current paths coupled in series between a power supply terminal Vcc and ground, with a common connection between the main current paths forming an output terminal OUT of the CMOS driver circuit 10. A capacitor 104 is shown connected between the output terminal and ground by a dashed line to represent the capacitance of an external load such as the gate capacitance of a power transistor being driven by the CMOS driver circuit.

The CMOS driver circuit 10 also includes first and second predriver circuits 14 and 16 having PMOS transistors 106 and 108 and NMOS transistors 110 and 112, respectively, with each pair of PMOS and NMOS transistors being coupled in series between Vcc and ground. A common connection between the main current paths of each pair of PMOS and NMOS transistors, at points d and e, respectively, is coupled to the gate electrode of a corresponding output driver circuit transistor 100 or 102.

The CMOS driver circuit 10 also includes a timing circuit 16, shown in FIG. 1 in block-diagram form, having an input terminal IN and three output terminals a, b, and c. The timing circuit is coupled to the two predriver circuits by coupling output terminal a to the gates of transistor 110, output terminal b to the gates of transistors 106 and 112, and output terminal c to the gate of transistor 108.

The timing circuit 16 of FIG. 1 may be implemented in several ways, two of which are illustrated in FIGS. 3 and 5. In the "digital" implementation shown in FIG. 3, input terminal IN is coupled to OR gates 300 and 302, and AND gate 304. The outputs of gates 302 and 304 are coupled to delay ($\Delta$) elements 306 and 308, respectively, and the outputs of these delay elements are cross-coupled back to second inputs of the gates 302 and 304. The output of delay element 306 is also coupled to a delay element 310, the output of which is in turn coupled to a second input of OR gate 300. The output of OR gate 300 forms timing circuit output c, with the output of delay element 306 forming timing circuit output terminal b and the output of delay element 308 forming the output terminal a of the timing circuit.

An "analog" implementation of timing circuit 16 is shown in FIG. 5 and includes first, second and third CMOS inverter circuits 500, 502 and 504, with each CMOS inverter circuit being composed of series-connected PMOS and NMOS transistors 506, 508; 510, 512; and 514; 516; respectively. The input terminal IN of the timing circuit 16 is coupled to the gate electrodes of transistors 506, 508, 510, 512, 514 and 516, and the output terminals of inverters 500, 502 and 504 are coupled to terminals a, b and c, respectively. Inverter circuits 500 and 504 further include current sources 518 connected between Vcc and transistor 506, and current source 520 connected between transistor 516 and ground, respectively.

The operation of the CMOS driver circuit 10 of FIG. 1 and the timing circuits 16 of FIG. 3 and FIG. 5 may be better understood with reference to the signal timing diagrams of FIGS. 2a–f, 4a–d and 6a–d, respectively.

Figure 2A:
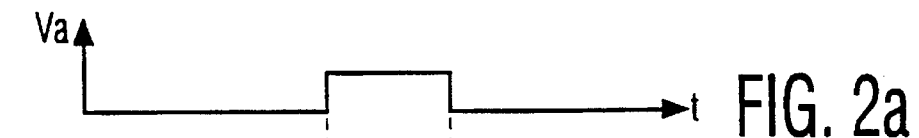
FIGS. 2a–2f show a series of waveforms which illustrate the operation of the circuit of FIG. 1.
Figure 2B:
Figure 2C:
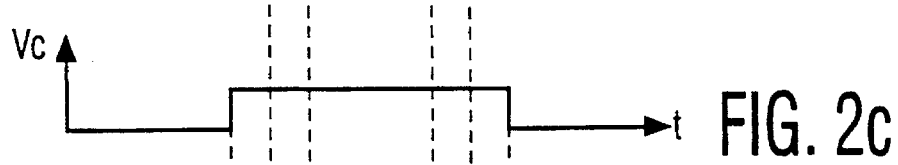
Figure 2D:
Figure 2E:
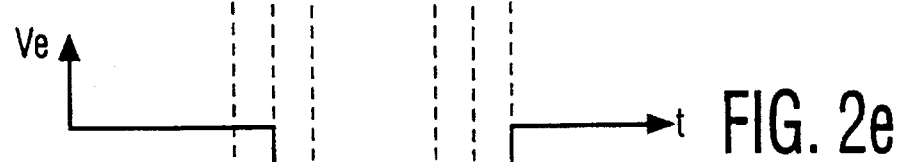
Figure 2F:
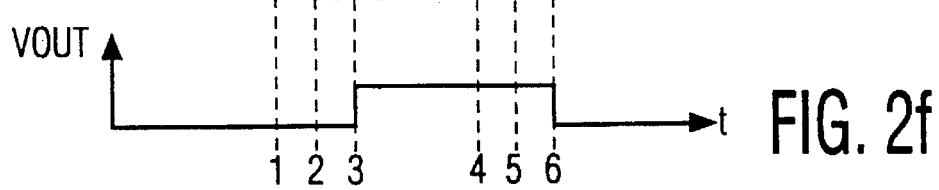

With reference to the CMOS driver circuit 10 of FIG. 1, FIGS. 2a, 2b and 2c show representative waveforms at output terminals a, b and c of timing circuit 16. As can be seen from FIGS. 2a–c, these three pulse waveforms have mutually-different starting (t1, t2 and t3) and ending (t4, t5 and t6) time points with reference to a common input signal VIN at terminal IN. When the waveforms of FIGS. 2a–2c are applied to the predriver circuits 14 and 16, the waveforms shown in FIGS. 2d and 2e are generated at predriver circuit output terminals d and e, respectively, and are applied to the gates of transistors 100 and 102 of the output driver circuit 12, respectively, to generate the waveform VOUT at the terminal OUT, as shown in FIG. 2f. Due to the unique pyramid-shaped pattern formed by the waveforms at terminals a, b, and c, three timing signals are used to directly or indirectly control the turn-on and turn-off timing of all six transistors in the CMOS driver circuit 10, to ensure that no transistor of a series-connected pair will turn on before its associated transistor turns off, thus substantially preventing shoot-through from occurring in either the predriver circuits or the output driver circuit.

Thus, for example, transistor 110 in FIG. 1 is turned on when the waveform in FIG. 2a goes high, at time t3, and is turned off when that waveform goes low at time t4. Transistor 106, connected in series with transistor 110, turns off when its gate voltage (Vb in FIG. 2b) goes high, at time t2, and turns back on at time t5 when Vb goes low. Since t2 is slightly earlier than t3, and t5 is slightly later than t4, there is no point in time when both transistors will be on simultaneously. The same relationship applies with respect to the two transistors of predriver circuit 16, since waveforms Vb and Vc have a similar timing relationship to that of Va and Vb, as shown in FIGS. 2b and 2c. As a result of the application of the waveforms of FIGS. 2a–2c to the predriver circuits 14 and 16, the waveforms Vd and Ve are generated at the outputs of the predriver circuits and are applied to the gates of transistors 100 and 102, respectively, of the output driver circuit 12.

Upon application of the waveforms Vd and Ve to the gates of transistors 100 and 102, the output waveform VOUT will be generated at the output terminal OUT as shown in FIG. 2f. Again, since the waveforms Vd and Ve are appropriately timed, transistor 102 will be turned off at t2, before transistor 100 is turned on at time t3, and similarly, transistor 100 will be turned off at time t5, before transistor 102 is turned on at time t6, thus substantially preventing unwanted shoot-through dissipation in the output driver stage.

In this manner, the circuit of the invention controls the turn-on and turn-off timing of six transistors with only three independently-generated timing signals (Va, Vb and Vc), thus offering substantially improved performance in a relatively simple and economical circuit. This is accomplished both by using the same signal Vb in both predrivers, and by deriving the timing signals for the output driver circuit from the predriver circuit outputs, Vd and Ve, without using separate timing circuitry for the output driver circuit. Stated another way, whereas it typically requires two properly-timed input waveforms to substantially eliminate no shoot-through current in each predriver or output driver circuit, the present invention enables the use of a total of only three different properly-timed input waveforms (instead of the six that would be conventionally required) to activate the two predriver circuits and the output driver circuit with substantially no shoot-through power dissipation, thus resulting in a cost-effective implementation of a low-power high-frequency CMOS driver circuit.

Two different implementations of the timing circuit 16, as previously described, are shown in FIGS. 3 and 5. The "digital" implementation of FIG. 3 uses logic gates and delay elements in order to generate the output waveforms Va, Vb and Vc from the input waveform VIN as shown in FIGS. 4a–4d with the AND and OR gates and the delay elements each operating in a conventional manner familiar to those of ordinary skill in this art and therefore not described in further detail here. Essentially, the logic gates, in combination with the delay elements in the circuit of FIG. 3 enable the generation of three waveforms Va, Vb and Vc having a pyramid-shaped timing relationship as shown in FIGS. 4b–4d from an input signal VIN at input terminal IN, with VIN having a pulsewidth of (t4-t1), Va having a pulsewidth of (t5-t3), Vb having a pulsewidth of (t6-t2) and Vc having a pulsewidth of (t7-t1).

In the "analog" implementation of the timing circuit 16 shown in FIG. 5 and described above, the relative timing of the three timing circuit output signals Va, Vb and Vc is obtained by inserting current sources 518 and 520 into the first and third CMOS inverter circuits 500 and 504, as shown in FIG. 5. The purpose of these current sources is to cause the leading or trailing edges of the pulses generated by the associated CMOS inverter to have a relatively more gradual rise or fall time than in a comparable CMOS inverter circuit without such a current source. Thus, for example, for a given input pulse VIN as shown in FIG. 6a, the output of the second CMOS inverter circuit 502 is shown as having a moderate rise time (t3-t1) and a moderate fall time (t7-t5). First CMOS inverter circuit 501, on the other hand, has an extended rise time (t4-t1) and a faster fall time (t5) due to the presence of current source 518 in the turn-on current path, and similarly, third CMOS inverter circuit 504 has a relatively fast rise time (t1) and an extended fall time (t8-t5) due to the presence of current source 520 in the turn-off path of the inverter circuit.

For purposes of switching the predriver and output driver circuits, the waveforms shown in FIGS. 6b–6d have effective transition points at times approximated by the midpoints of the sloping portions of the waveforms. Thus, waveform Va has an effective pulsewidth (t5-t3) which is less than the effective pulsewidth of waveform Vb (t6-t2), and the effective pulsewidth of waveform Vc (t7-t1) is greater than the pulsewidth of waveform Vb. For purposes of illustration, note that both the rise time and the fall time of the waveform Vb, generated by the second CMOS inverter 502 which has no current source, is shown as having moderate rise and fall times, shown for illustration as approximately half way between the fast and slow rise and/or fall times of the waveforms Va and Vc. In this manner, the circuit of FIG. 5 generates three different timing signals analogous to those shown in FIGS. 2a–2c and 4b–4d.

Thus, the present invention provides a CMOS driver circuit capable of driving relatively large off-chip capacitive loads at high frequencies in the range of several MHz. Additionally, the invention provides a CMOS driver circuit capable of driving relatively large capacitive loads at high frequencies without significant shoot-through power dissipation.

While the invention has been particularly shown and described with reference to several preferred embodiments thereof, it will be understood by those skilled in the art that various changes in form and detail may be made without departing from the spirit and scope of the invention.

What is claimed is:

1. A CMOS driver circuit having an input terminal and an output terminal, and comprising:

an output driver circuit having first and second MOS transistors of a first and a second type, respectively, and having their main current paths coupled in series between a power supply terminal and a common terminal, a common connection between the main current paths of said first and second MOS transistors comprising the output terminal of said CMOS driver circuit;

a first predriver circuit having third and fourth MOS transistors of said first and second types, respectively, and having their main current paths coupled in series between said power supply terminal and said common terminal, a common connection between the main current paths of said third and fourth MOS transistors being coupled to a control electrode of said first MOS transistor;

a second predriver circuit having fifth and sixth MOS transistors of said first and second types, respectively, and having their main current paths coupled in series between said power supply terminal and said common terminal, a common connection between the main current paths of said fifth and sixth MOS transistors being coupled to a control electrode of said second MOS transistor; and a timing circuit having an input terminal which comprises the input terminal of said CMOS driver circuit, and first, second and third output terminals for providing different first, second and third timing signals to a control electrode of said fourth, third and sixth, and fifth MOS transistors, respectively.

2. A CMOS driver circuit as in claim 1, wherein said timing signals comprise substantially square-wave pulses, the pulses of each timing signal having different pulsewidths than the pulses of the other timing signals.

3. A CMOS driver circuit as in claim 1, wherein said timing signals comprise pulses, the pulses of each timing signal having at least one of a different rise time and a different fall time than the pulses of the other timing signals.

4. A CMOS driver circuit as in claim 3, wherein said timing circuit comprises first, second and third CMOS inverter circuits each coupled between said power supply terminal and said common terminal, an input of each inverter circuit being coupled to the input terminal of said timing circuit, and an output terminal of the first, second and third CMOS inverter circuits being connected, respectively, to the first, second and third output terminals of said timing circuit, a first current source being coupled between a main current path of said first CMOS inverter circuit and said power supply terminal, and a second current source being coupled between a main current path of said third CMOS inverter circuit and said common terminal.

5. A CMOS driver circuit as in claim 1, wherein said first timing signal comprises a first pulse having a first pulsewidth, said second timing signal comprises a second pulse having a second pulsewidth greater than said first pulsewidth, and said third timing signal comprises a third pulse having a third pulsewidth greater than said second pulsewidth.

6. A CMOS driver circuit as in claim 5, wherein said timing circuit comprises a first and a second OR gate and an AND gate each having a first input coupled to the input terminal of said timing circuit, a first delay circuit having an input coupled to an output of said first OR gate, a second delay circuit having an input coupled to an output of said first delay circuit and an output coupled to a second input of said second OR gate, and a third delay circuit having an input coupled to an output of said AND gate and an output coupled to a second input of said first OR gate, the output of said first delay circuit being coupled to a second input of said AND gate, and the output of said third delay circuit, the output of said first delay circuit and an output of the second OR gate comprise, respectively, the first, second and third output terminals of the timing circuit.

\* \* \* \* \*